United States Patent
Ono et al.

(10) Patent No.: US 6,687,633 B2
(45) Date of Patent: Feb. 3, 2004

(54) INSPECTION SYSTEM, INSPECTION APPARATUS, INSPECTION PROGRAM, AND PRODUCTION METHOD OF SEMICONDUCTOR DEVICES

(75) Inventors: Makoto Ono, Yokohama (JP); Hisafumi Iwata, Hayama (JP)

(73) Assignee: Hitachi, Ltd., Tokyo (JP)

( * ) Notice: Subject to any disclaimer, the term of this patent is extended or adjusted under 35 U.S.C. 154(b) by 44 days.

(21) Appl. No.: 10/079,518

(22) Filed: Feb. 22, 2002

(65) Prior Publication Data

US 2002/0143483 A1 Oct. 3, 2002

(30) Foreign Application Priority Data

Mar. 29, 2001 (JP) ........................................ 2001-094531

(51) Int. Cl.⁷ .............................................. G01N 37/00
(52) U.S. Cl. ............................................. 702/83; 716/4
(58) Field of Search ........................ 702/83, 84; 716/4; 714/718, 724

(56) References Cited

U.S. PATENT DOCUMENTS

| | | | |
|---|---|---|---|
| 5,598,341 A | | 1/1997 | Ling et al. |
| 6,009,545 A | * | 12/1999 | Tsutsui et al. ............... 714/718 |
| 6,367,040 B1 | * | 4/2002 | Ott et al. ...................... 714/724 |
| 6,487,511 B1 | * | 11/2002 | Wooten ........................ 702/84 |
| 6,496,958 B1 | * | 12/2002 | Ott et al. ........................ 716/4 |

FOREIGN PATENT DOCUMENTS

| | | |
|---|---|---|
| JP | 48-40376 | 6/1973 |
| JP | 2533610 | 6/1996 |
| JP | 08-162510 | 6/1996 |
| JP | 2981434 | 9/1999 |
| JP | 2000-223385 | 8/2000 |

OTHER PUBLICATIONS

"Modeling of defects in integrated circuit photolithographic patterns", Stapper, *IBM Journal of Research and Development*, vol. 28, No. 4, 1984, pp. 461–475.

"The Use and Evaluation of Yield Models in Integrated Circuit Manufacturing" Cunningham, *IEEE Transaction on Semiconductor Manufacturing*, vol. 3, No. 2, 1990, pp. 60–71.

"A Mathematical Model for Defect Impact Based on In–Line vs Test Data Correlations", Fernandez et al., *Proceedings of 1999 IEEE/SEMI Advanced Semiconductor Manufacturing Conference*, pp. 92–96.

"In–Line Yield Prediction Methodologies Using Patterned Wafer Inspection Information", Nurani et al, *IEEE Transaction on Semiconductor Manufacturing*, vol. 11, No. 1, Feb., 1998, pp. 40–47.

* cited by examiner

*Primary Examiner*—John Barlow
*Assistant Examiner*—Xiuqin Sun
(74) *Attorney, Agent, or Firm*—McDermott, Will & Emery (57) ABSTRACT

In the wafer production process of a semiconductor integrated circuit, an inspection system and an inspection apparatus that convert and output a yield loss at high accuracy from the result of a defect inspection, such as a dark-field inspection and a bright-field inspection without waiting for the result of the final probing test. Defect map data read processing and kill ratio computation data read processing are performed. Subsequently, kill ratio computation processing every defect computes a kill ratio every defect using defect map data and kill ratio computation data. Subsequently, kill ratio computation processing every chip computes a kill ratio every LSI chip using the kill ratio every defect. Subsequently, yield loss computation processing computes a yield loss of the defect map data using the kill ratio every chip and yield loss output processing outputs the computation result.

8 Claims, 10 Drawing Sheets

| DEFECT ID | CHIP COLUMN | CHIP ROW | X WITHIN CHIP | Y WITHIN CHIP | SIZE | KILL RATIO |
|---|---|---|---|---|---|---|
| 1, | 3, | 1, | 10, | 80, | 0.5, | 0.4 |
| 2, | 3, | 1, | 85, | 80, | 0.3, | 0.1 |
| 3, | 1, | 2, | 70, | 20, | 1.1, | 0.7 |
| 4, | 2, | 3, | 80, | 90, | 0.9, | 0.3 |

131
| INSPECTION STEP | INSPECTION DATE |
|---|---|
| P0001, | 2000/11/29 |
| P0002, | 2000/12/02 |
| P0003, | 2000/12/10 |

132
| INSPECTION STEP | INSPECTION DATE |
|---|---|
| P0001, | 2000/12/03 |
| P0002, | 2000/12/10 |
| P0003, | 2000/12/14 |

133
| INSPECTION STEP | INSPECTION DATE |
|---|---|
| P0001, | 2000/12/04 |
| P0002, | 2000/12/12 |

134
| INSPECTION STEP | INSPECTION DATE |
|---|---|
| P0001, | 2000/12/06 |
| P0002, | 2000/12/13 |

135
| INSPECTION STEP | INSPECTION DATE |
|---|---|
| P0001, | 2000/12/10 |
| P0002, | 2000/12/15 |

136
| INSPECTION STEP | INSPECTION DATE |
|---|---|
| P0001, | 2000/12/13 |

INSPECTION SYSTEM, INSPECTION APPARATUS, INSPECTION PROGRAM, AND PRODUCTION METHOD OF SEMICONDUCTOR DEVICES

FIELD OF THE INVENTION

The present invention relates to an inspection system that manages a particle or a pattern defect generated in a production process of an electronic device, such as a semiconductor integrated circuit, a thin film magnetic head, and an optical device, or an inspection apparatus that detects the particle or the pattern defect, and a production method that uses it.

BACKGROUND OF THE INVENTION

A prior art is described below taking the production of a semiconductor integrated circuit as an example. The semiconductor integrated circuit (hereinafter referred to as LSI) is generally divided into the front-end process in which a layer, such as a circuit pattern, is multiply layered on a silicon wafer and multiple chips (elements) are manufactured and the succeeding process in which the layer is isolated for each chip and products are completed. The greater part of faults that will be generated during production is generated in the huge front-end process accompanied by microfabrication. Accordingly, the improvement of yield in the front-end process is a very important issue for low cost production. Here, the yield in the front-end process is good product ratio determined based on the result of a probing test that is the final test of the front-end process, that is, a ratio of good chips to the total number of chips on the wafer.

The faults of the front-end process can roughly be divided into a functional fault and a parametric fault. The functional fault indicates a fault in which a particle or a pattern defect (hereinafter generically referred to as a defect) generated in the course of production becomes the main cause, which will cause the disconnection and short circuit of a circuit pattern and will not operate a circuit normally. On the other hand, the parametric fault is a fault in which the operation speed of a transistor will not satisfy a design specification due to fine process dispersion, such as fabrication dimensions or oxide film thickness.

In order to detect the particles or the pattern defects that cause the functional fault, a defect inspection tool, such as a dark-field inspection tool or a bright-field inspection tool is used in the front-end process production line. The dark-field inspection tool, as described in Japanese Patent No.2533610, generally, irradiates a wafer with laser beam and detects the scattered light. The bright-field inspection tool, as described in Japanese Patent No.2981434, photographs an image of a circuit pattern and detects abnormal spots by image processing.

In order to detect the particles or the pattern defects that cause the functional fault, a defect inspection tool, such as a dark-field inspection tool or a bright-field inspection tool is used in the preprocess production line. The dark-field inspection tool, as described in Japanese Patent No.2533610, generally, irradiates a wafer with laser beam and detects the scattered light. The bright-field inspection tool, as described in Japanese Patent No.2981434, photographs an image of a circuit pattern and detects abnormal spots by image processing.

The production line manages the number of defects detected usually by the defect inspection tool to maintain yield. This is based on a concept that the yield can be maintained highly by stably holding the number of defects. However, because an interrelationship is not necessarily established between the number of defects and the yield, it is not said the best policy to manage the number of defects. This is because a degree (yield loss) in which the yield deteriorates differs according to the size and type of the generated defect and the process or position in which the defect was generated.

One method by which the result of a defect inspection is converted to a yield loss and managed is disclosed in Japanese Patent Laid-open No. 2000-223385. This method associates the result of a probing test and the result of a defect inspection every LSI chip and computes the yield loss limited by defects. However, this method requires the result of a probing test that is the final test of the front-end process every wafer and the yield loss will not output immediately after a defect inspection. Accordingly, the problem was that time is required until the yield loss is computed.

Another method by which the result of a defect inspection is converted to a yield loss and managed observes individual defects through an electron microscope after defect inspection and classifies the defects into a fatal defect and a non-fatal defect, then manages the number of fatal defects. This method does not require the result of the probing test if the accuracy of classification is high and can obtain the yield loss after the defects are observed. However, because an LSI circuit pattern is scaled down and a defect inspection tool is made high accurate, the number of defects detected by the defect inspection tool is continuing a great increase. Accordingly, it is difficult due to the time limit to observe and classify all defects through the electron microscope.

As an attempt that solves these problems, a method by which the yield loss is predicted from the result of a defect inspection is proposed. The typical method is called a critical area analysis. The critical area analysis is described in Japanese Patent Laid-open No.Sho48-40376, Japanese Patent Laid-open No.Hei08-162510, U.S. Pat. No. 5,598, 341, and the paper "Modeling of Defects in Integrated Circuit Photolithographic Patterns" run in the monographs "IBM Journal of Research and Development" (Volume 28, No.4, 1984). This method has a supposition that defects are generated in random points and the distribution of defect size is fixed. That the distribution of defect size is fixed is premised on an assumption that if there are a small number of large defects and a great number of small defects, the relationship is always invariable. However, defects that will be generated on an actual wafer will not always be generated in random points. Further, the size distribution is not fixed, and only the small defects may also be generated frequently. Accordingly, the critical area analysis had the problem of prediction accuracy.

SUMMARY OF THE INVENTION

The present invention has been made in view of the above circumstances and provides an inspection system, an inspection apparatus, an inspection program, and a production method of semiconductor devices.

The present invention converts a yield loss at high accuracy from the result of a defect inspection without waiting for the result of a probing test. Further, even if defects are not observed through an electron microscope, the yield loss can be converted. In a production line, such a strategy that chiefly analyses and manages an apparatus of the production process for which a measure must be taken can be worked out.

Further, a critical area analysis that is a conventional yield loss prediction art had a precondition that defects are generated in random points or the distribution of defect size is fixed. However, the present invention does not have such precondition, and is effective even if the defects are not generated in the random points. Further, even if the distribution of defect size differs every wafer, prediction accuracy will not be decreased.

As a means for solving the above issue, first, one example is an inspection system provided with an analyzing unit that has an inspection apparatus that detects the position and size of particles or pattern defects that an inspected object has, a storage means that is connected to the inspection apparatus via a network and stores inspection data that the inspection apparatus detected and obtained and kill ratio computation data for the position and size of the particles or pattern defects set in a device formed in the inspected object, and a computation means that computes kill ratios of individual particles or pattern defects from the inspection data that the inspection apparatus detected and obtained and the kill ratio computation data and kill ratios of individual chips of the inspected object from the kill ratios computed from the individual particles or pattern defects.

Another example is an inspection apparatus provided with an inspection means that detects the position and size of particles or pattern defects that an inspection object has, a storage means that stores inspection data detected and obtained by the inspection apparatus and kill ratio computation data for the position and size of the particles or pattern defects set in each device that is formed in the inspected object, and a computation means that computes kill ratios of individual particles or pattern defects from the inspection data and the kill ratio computation data and compute skill ratios of individual chips of the inspected object from the kill ratio computed from the individual particles or pattern defects.

BRIEF DESCRIPTION OF THE DRAWINGS

Preferred embodiments of the present invention will be described in detail based on the followings, wherein.

DESCRIPTION OF THE PREFERRED EMBODIMMENTS

Figure 3:
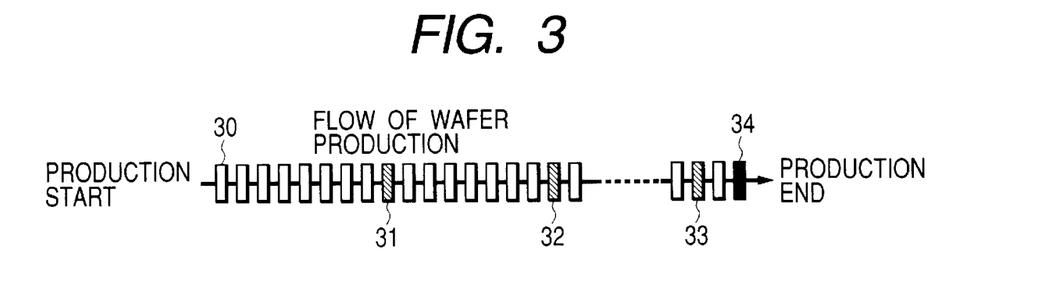
FIG. 3 shows an example of the production process of wafer.

Before embodiments of the present invention are shown, first, the inline defect inspection of an LSI wafer is described with reference to FIG. 3. The wafer production process has many production processes and inspections from the production start to the production end. In FIG. 3, a white square, such as 30, on a colored background is an individual production process, shaded squares 31 to 33 indicate defect inspections, and a black square 34 indicates a probing test of the final test. In the defect inspection, the coordinates and size of defects are output. Further, in the probing test 34, good or bad products are decided every LSI chip formed on the wafer.

Next, the embodiments of the present invention are described with reference to the drawings.

Figure 1:
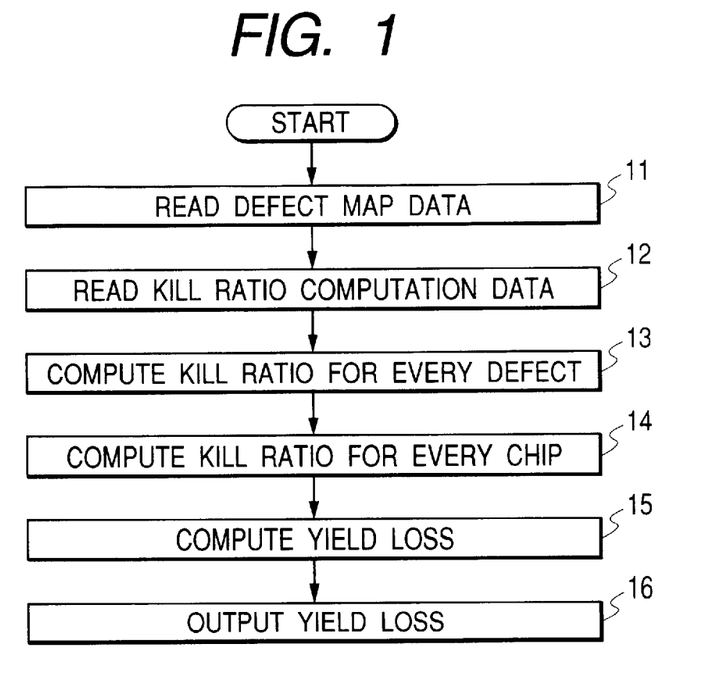
FIG. 1 is a drawing of an embodiment of the computation procedure of a yield loss according to the present invention.

FIG. 1 is an embodiment showing the procedure of converting the result of a defect inspection to a yield loss in the production process of an LSI chip according to the present invention.

In FIG. 1, processing 11 reads defect map data.

Figure 4:
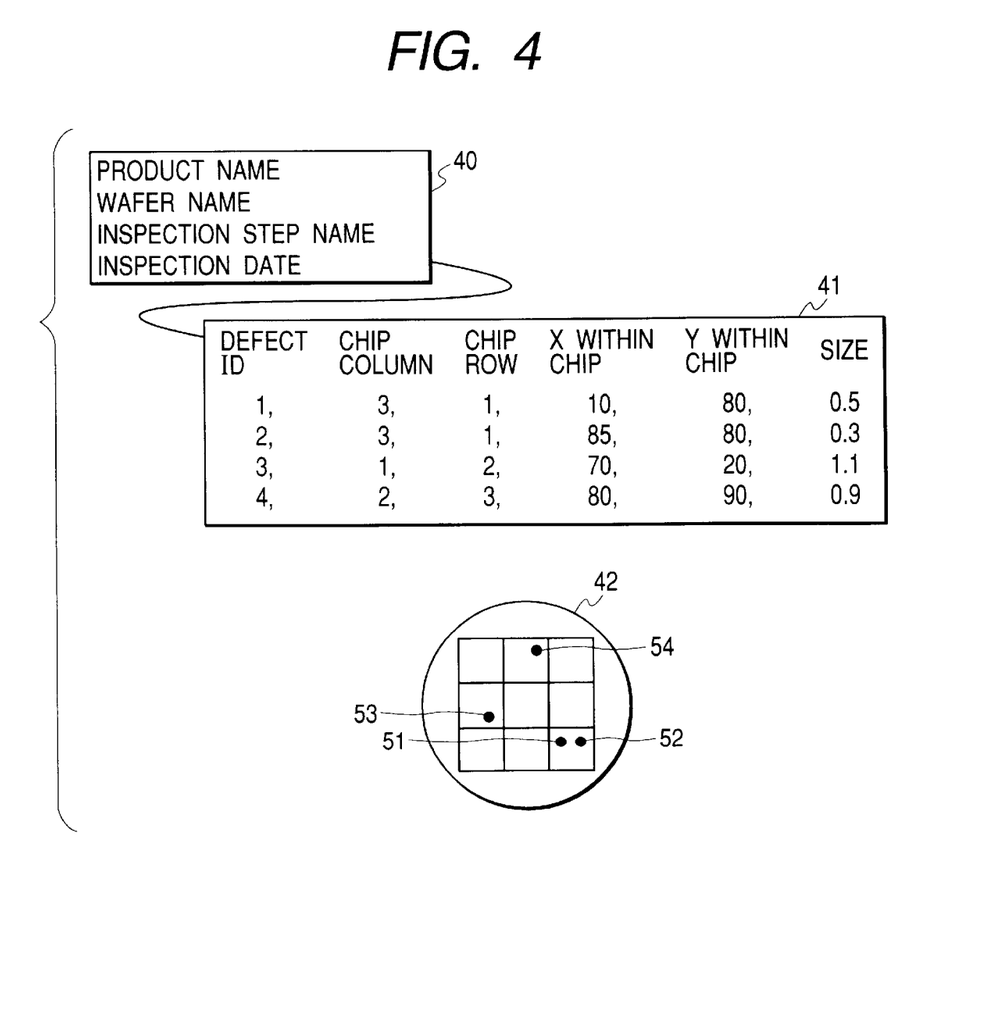
FIG. 4 shows an example of defect map data.

FIG. 4 shows an example of the defect map data. In the example of FIG. 4, defect map data 41, such as coordinates and size every defect, is provided for supplementary information 40, such as a product name, a wafer name, an inspection step name and an inspection date. It indicates that the defect map data 41 has four defects, and a serial number is marked on each defect as a "defect identifier (ID)". For example, the defect of defect ID 1 exists in coordinate 3 of the chip column on a wafer and coordinate 1 of the chip row and it indicates that the coordinates within the chip are X=10 and Y=80 and the size of the defect is 0.5. 42 is the defect map data 41 in which the wafer is shown in a map shape. The round frame of 42 indicates the wafer. The square frame is an LSI chip formed on the wafer, and black points 51 to 54 indicate the position of the defect. The points 51, 52, 53, and 54 correspond to the defect ID 1 of the defect map data 41, the defect ID 2 of the defect map data 41, the defect ID 3 of the defect map data 41, and the defect ID 4 of the defect map data 41 respectively. Here, the size of the defect can be defined, for example, using the length viewed from the lengthwise direction of a particle, but the definition is not always limited to that case. As another method, even if the size of the defect is defined as $\sqrt{(\Delta X \Delta Y)}$ using the length $\Delta Y$ in the lengthwise direction of the particle and the length $\Delta X$ in the direction normal to the lengthwise direction, the definition is within the scope of the present invention.

Figure 5:
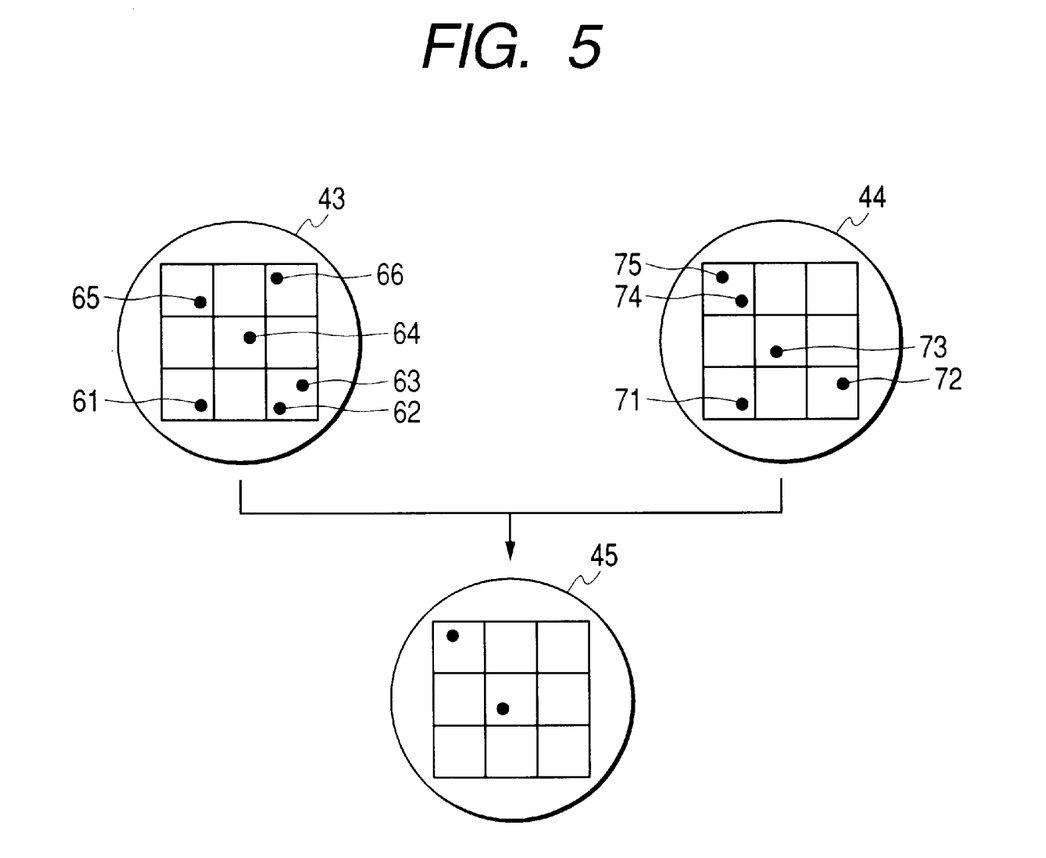
FIG. 5 shows an example of the detection method of adder defects.

The defect map data read by the processing 11 may also be the result of a defect inspection itself, but, as shown in FIG. 5, it may also be data operated using the results of multiple defect inspections. The operation of FIG. 5 is called adder defect extract processing. In FIG. 5, defect map data 43 is the result of the defect inspection 31 in FIG. 3 and defects 61 to 66 are detected. Defect map data 44 is the result of the defect inspection 32 in FIG. 3 and defects 71 to 75 are detected. Here, the defects 61 and 71, the defects 63 and 72, and the defects 65 and 74 are detected in the same coordinates respectively. These are detected in the defect inspection 31 and redetected also in the defect inspection 32. The adder defect extract processing extracts only the defects generated in the production process of the defect inspections 31 and later from the result of the defect inspection 32, and the operation result is defect map data 45.

Subsequently, in FIG. 1, processing 12 reads kill ratio computation data.

Figure 6:
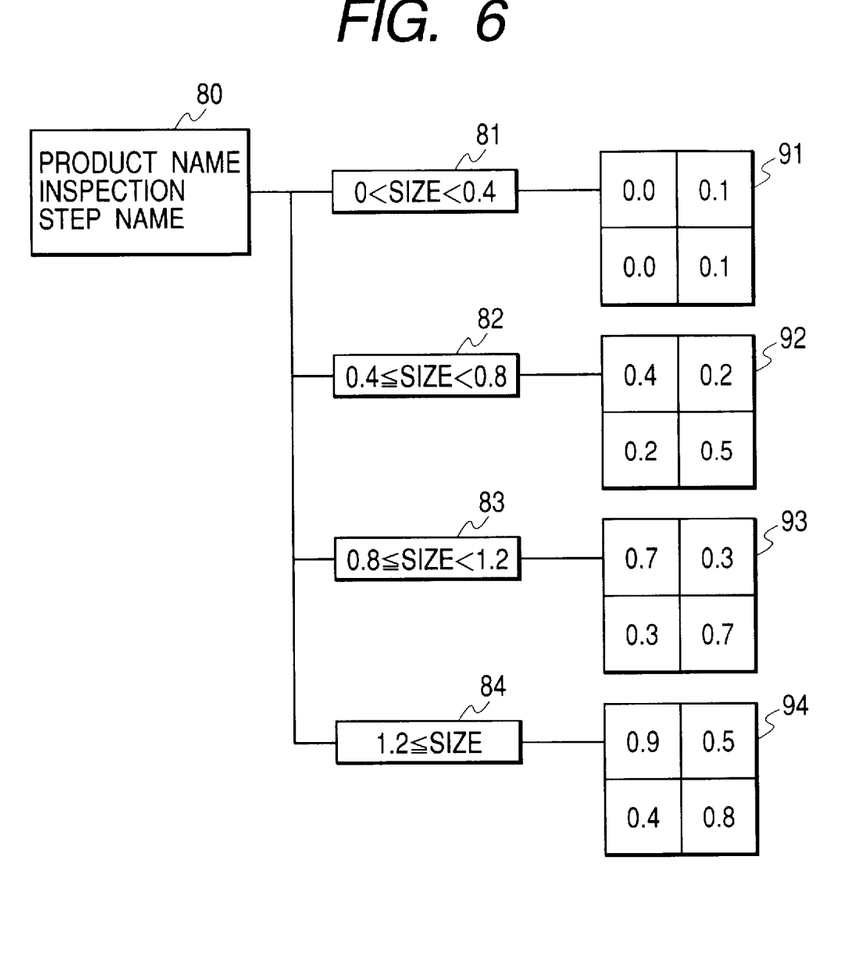
FIG. 6 shows an example of kill ratio computation data.

FIG. 6 is an example of the kill ratio computation data. In the example of FIG. 6, data for computing a kill ratio of a defect every defect size is written to supplementary information 80, such as a product name and an inspection step name. 81 indicates a link to data 91 of which the size of the defect is 0 or more and less than 0.4. The link destination 91 is the kill ratio computation data. When an LSI chip is divided into four flatly, if the defect exists at the lower left of the chip, the kill ratio is computed as 0.0. If the defect exists at the lower right, the kill ratio is computed as 0.1. If the defect exists at the upper left, the kill ratio is computed as 0.0 and if the defect exists at the upper right, the kill ratio is computed as 0.1. Similarly, 82 indicates a link to data 92 of which the size of the defect is 0.4 or more and less than 0.8. In the case of the kill ratio computation data 92, if the defect exists at the lower left of the chip, the kill ratio is computed as 0.2. If the defect exists at the lower right, the kill ratio is computed as 0.5. If the defect exists at the upper left, the kill ratio is computed as 0.4 and if the defect exists at the upper right, the kill ratio is computed as 0.2. 83 is a link to data 93 of which the size of the defect is 0.8 or more and less than 1.2. 93 is the kill ratio computation data of the link destination. 84 is a link to data 94 of which the size of the defect is 1.2 or more. 94 is the kill ratio computation data of the link destination. The example of FIG. 6 has a total of 16 kill ratio computation data items in which the size is split into four and the inside of the LSI chip is split into four. The splitting method is not limited to this example. As the splitting method is subdivided, the computational accuracy of the target yield degradation is improved. When the LSI chip is split in this method to manage data and the kill ratio computation data is held in accordance with the size and split area of the defect, a detailed kill ratio can be used in accordance with the circuit pattern density (dense or sparse state of a circuit layout) every area of the LSI chip. Accordingly, the computational accuracy of the yield loss described later can be improved.

Next, in FIG. 1, processing 13 computes a kill ratio every defect.

Figure 7:
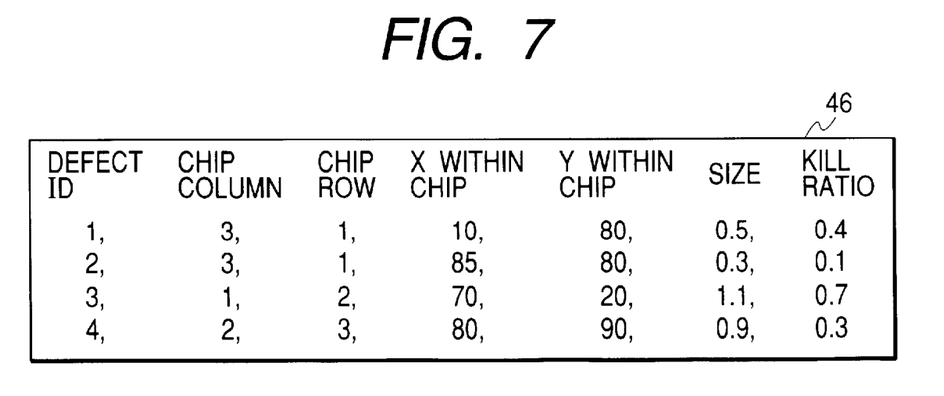
FIG. 7 shows an example of the defect map data with kill ratios.

46 of FIG. 7 is defect map data with kill ratios computed from the defect map data 41 of FIG. 4 and the kill ratio computation data of FIG. 6. In the defect map data 46 with kill ratios, the column of the "kill ratio" is additionally written to the defect map data 41. For example, because the defect ID 1 is 0.5 in size, 82 of the kill ratio computation data of FIG. 6 is referred to. Subsequently, 92 of the link destination of 82 is referred to and the coordinates within the chip is X=10 and Y=80, the kill ratio is calculated as 0.4 corresponding to the upper left within the chip. The relevant computation result is written to the column of the kill ratio.

Subsequently, in FIG. 1, processing 14 computes a kill ratio for every chip.

Figure 8:
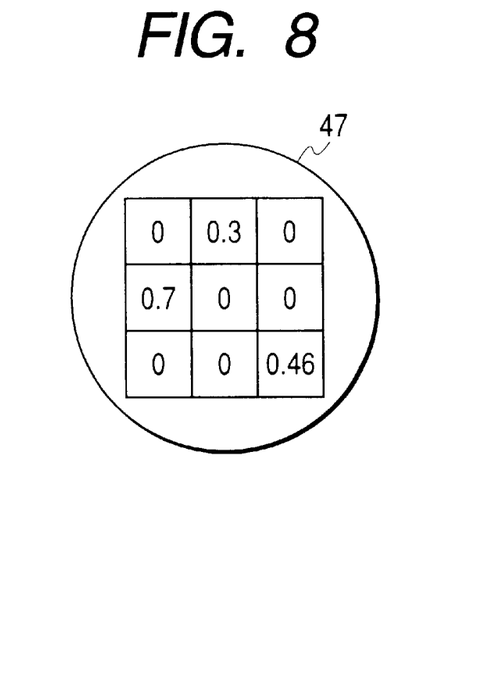
FIG. 8 shows an example of the kill ratio map of chips.

FIG. 8 is a kill ratio map every chip computed from the defect map data 46 with kill ratios of FIG. 7. "0", "0.46", "0.7", and "0.3" within the map 47 indicate the kill ratio of each LSI chip. First, the defect is allocated every chip from the coordinates of the chip column and chip row of the defect map data 46 with kill ratios. Because one defect of only the defect ID 3 exists in the chip column 1 and chip row 2 and the kill ratio of the defect ID 3 is 0.7, the kill ratio of the chip is also set to "0.7". Because one defect of only defect ID 4 exists in the chip column 2 and the chip row 3 and the kill ratio of the defect ID 4 is 3, the kill ratio of the chip is also set to "0.3". Two defects of the defect ID 1 and the defect ID 2 exist in the chip column 3 and the chip row 1. Accordingly, when 1−{(1−0.4)×(1−0.1)} is computed as the kill ratio of a chip, the kill ratio of the chip is set to "0.46" because the kill ratio of the defect ID 1 is 0.4 and the kill ratio of the defect ID 2 is 0.1. Because another chip has no defect, the kill ratio of the chip is set to "0".

Subsequently, in FIG. 1, processing 15 computes a yield loss.

Specifically, the average of all chips of the kill ratio map 47 of FIG. 8 is computed. That is, when (0.46+0.7+0.3)/9 is computed, the average is set to 0.16. As a result, the yield loss is computed as 16%.

Figure 10:
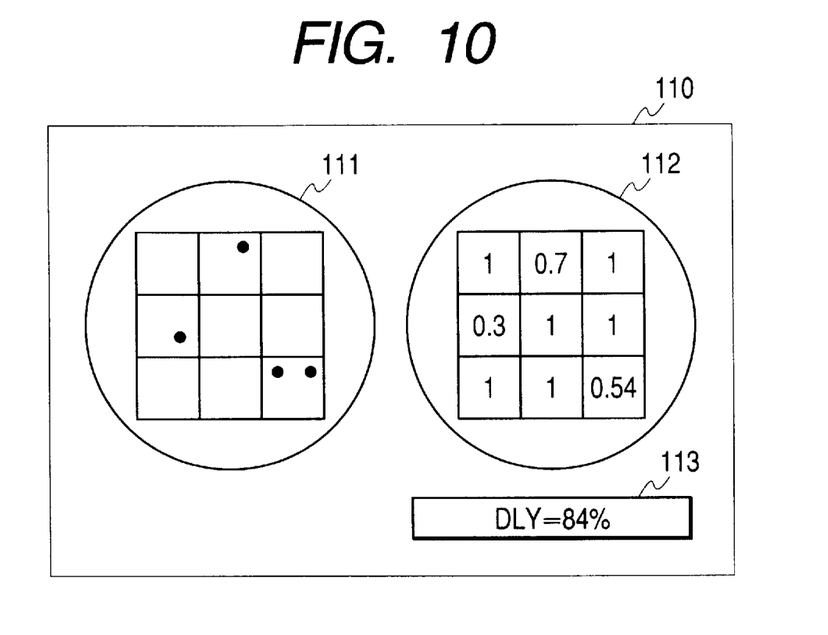
FIG. 10 shows another example of the result output screen.
Figure 11:
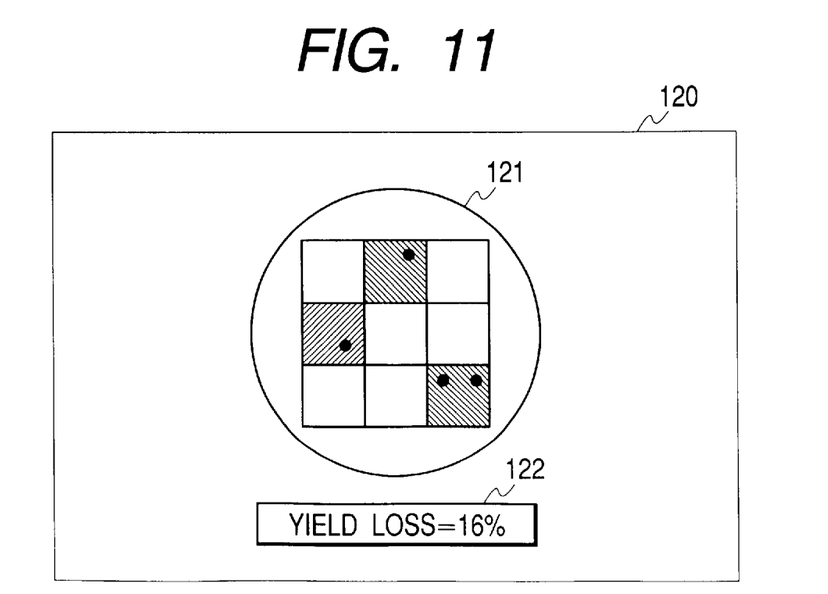
FIG. 11 shows another example of the result output screen.

Subsequently, in FIG. 1, processing 16 outputs the computed yield loss. 16% of the computation result ought be output merely. However, as shown in FIGS. 9 to 11, outputting a defect map and a kill ratio map of a chip concurrently is kind to the user.

If a yield loss can be computed from the defect map data in this method, it can be decided whether a measure for a fault process should immediately be taken costing expenses or the priority of the measure can be lowered in accordance with a value of the yield loss from the standpoint of quality control. Further, It can be grasped quantitatively from the standpoint of production control that the production volume of a product decreases when the yield loss is high. Accordingly, to secure the production volume of the product as scheduled, wafers are immediately inputted into once more.

The program processing shown in FIG. 1 of this embodiment can calculate a yield loss by only using the latest results of the defect inspections 31 and 32 without using the inspection result of the probing test 34 shown in FIG. 3. Accordingly, the production volume of the wafer can be quickly adjusted based on an early prediction and the accuracy at which a prearranged volume is soundly produced at a customer's delivery date. In this embodiment, the yield loss is computed as 16%. Based on this output value, the use can adjust the production volume by adding the yield loss to the volume of orders received. Further, a production volume can be adjusted by sending instruction information about its adjustment to a production line system.

Figure 9:
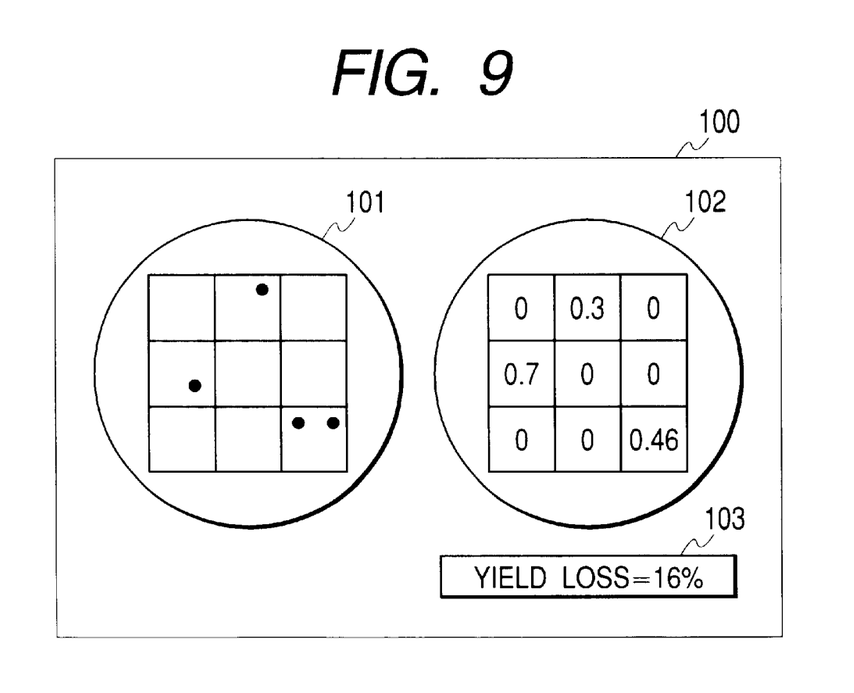
FIG. 9 shows an example of a result output screen.

FIG. 9 is an example in which a defect map 101, a kill ratio map 102, and a yield loss 103 are lined up and output to a screen 100.

FIG. 10 is an example in which the defect map 101 and probability on which good products are obtained contrary to a kill ratio are output in a map shape as shown in 112. The probability on which the good products are obtained is a value in which the kill ratio is subtracted from 1 for each chip. 113 is a DLY (Defect Limited Yield), that is, indicates that the value in which a yield loss was subtracted from 100% is output as a "yield limited due to defects". Another index that can be computed from the yield loss, not the yield loss, like the DLY, is also effective. Besides, another index can be computed using formulas described in the paper "The Use and Evaluation of Yield Models in Integrated Circuit Manufacturing" by J. A. Cunningham run in on pages 60 to 71 of Volume 3, No.2, 1990 of the monographs "IEEE Transactions on Semiconductor Manufacturing". For example, defect density is the one example in which the logarithm of obtained DLY is secured and divided by the area of an LSI chip.

FIG. 11 is a map 121 on which a defect map and a kill ratio map are overlapped and output to a screen 120. In this example, the kill ratio map was output by shading or color separation instead of a numeric value. 122 is a yield loss.

To this point, the embodiment in which a yield loss is computed from the one defect map data 41 and output was described.

Subsequently, an embodiment of a method by which a yield loss is managed from the defect results of multiple wafers performed in a certain period is described.

Figure 12:
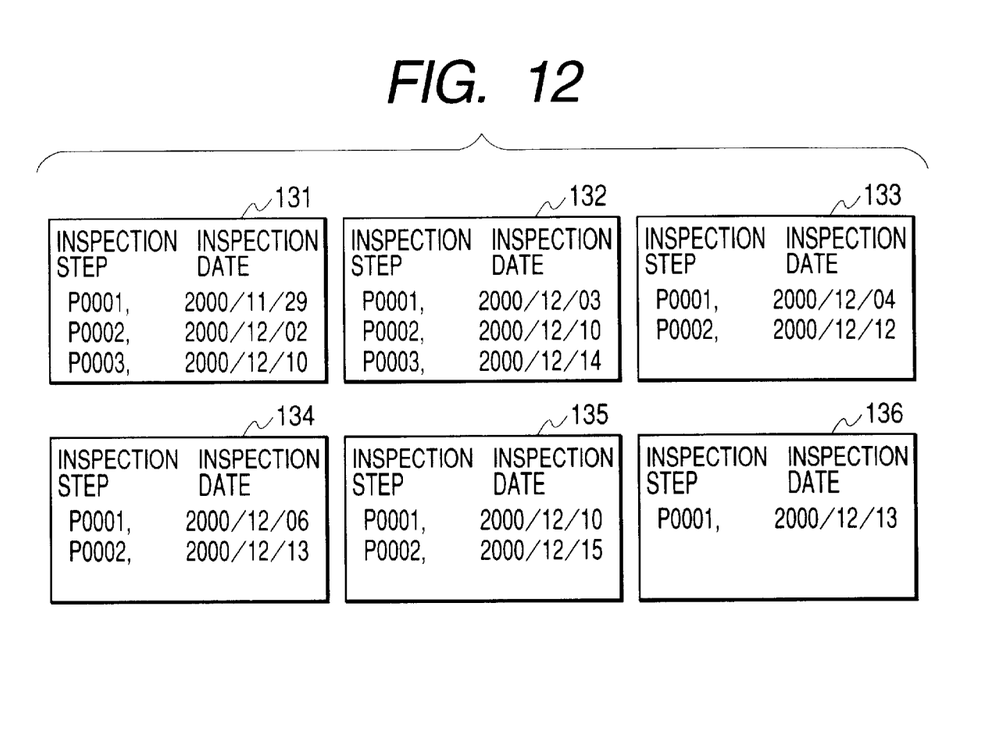
FIG. 12 shows an example of inspection history every wafer.

FIG. 12 is an example of the result in which a history of the defect inspection was checked on Dec. 16, 2000. In the production line shown in the example, the defect inspections of LSI wafers are made in three steps P0001, P0002, and P0003. This example is the result in which the inspection history of the wafers for which defect inspections were made in any of the three steps between Dec. 10 and Dec. 15, 2000. Six wafers were inspected in any of the three steps in this period. The wafer of an inspection history 131 was inspected in the step P0001 on Nov. 29, 2000 and inspected in the step P0002 on December 2, then inspected in the step P0003 on December 10. This wafer conducted the step P0003 in the specified period. The wafer of an inspection history 132 was inspected in the steps P0001 to P0003 on Dec. 3, Dec. 10, and Dec. 14, 2000 respectively. This wafer conducted the two steps P0002 and PO003 in the specified period. The wafer of an inspection history 133 was inspected in the step P0001 on Dec. 4, 2000 and in step P0002 on December 12, but it was not inspected in the step P0003 at the date when the history was checked. This wafer conducted the step P0002 in the specified period. The wafer of an inspection history 134 and the wafer of an inspection history 135 inspected the steps P0001 and P0002 respectively and did not inspect the step PO003 yet. The wafer of an inspection history 136 inspected only the step P0001, but did not inspect the steps P0002 and P0003 yet.

Figure 13:
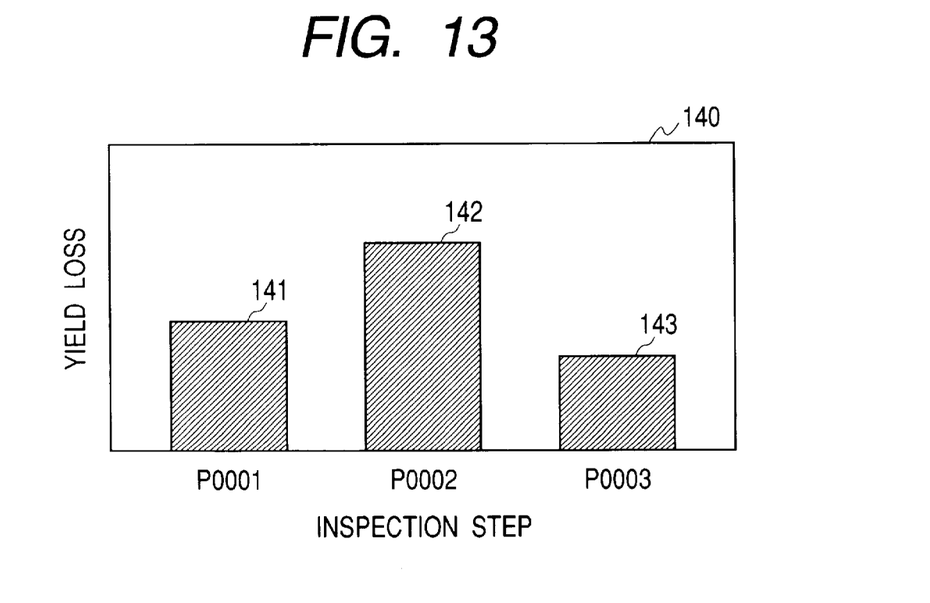
FIG. 13 shows an example of a result output graph.

FIG. 13 is an example in which the average of the yield loss of each inspection step in the specified period was computed based on the inspection history shown in FIG. 12 and a graph 140 was output as the result. 141 is a yield loss computed from the wafer inspected in the step P0001 between Dec. 10 and 15, 2000. The inspection histories of the object wafer are 135 and 136. The inspection histories of the wafer that became the object of the computation of a yield loss 142 are 132 to 135. The inspection histories of the wafer that became the object of a yield loss 143 are 132 to 135. The graph 140 is computed from the defect map data of the wafer that differs every process. Besides, the computation method of the yield loss in each inspection of each wafer is the same method as in the flow of FIG. 1 shown in the above embodiment.

Because this embodiment in which a yield loss is computed by specifying a fixed period uses the latest defect inspection data concerning multiple wafers including the wafer that is being processed currently, a part in which a fatal defect that the current production line has may highly be generated can be extracted with good accuracy. In the output of FIG. 13, because it turns out that the yield loss of inspection process P0002 is highest, it is known that the efficiency for improving the yield is highest if the process group between the inspection steps P0001 and P0002 is checked. Further, because this embodiment uses the average of defect inspection data based on multiple wafers, the embodiment can predict the yield loss with higher accuracy than an embodiment in which the yield loss is computed based on the defect inspection data of the single wafer described above.

An example of the embodiment of a method by which a yield loss is computed from the defect map data and the result is supplied to the user is described above.

Subsequently, a creation method of the kill ratio computation data of which the example is shown in FIG. 6 is described. The kill ratio computation data shown in FIG. 6 needs to be previously computed and registered when the yield loss is computed.

Figure 14:
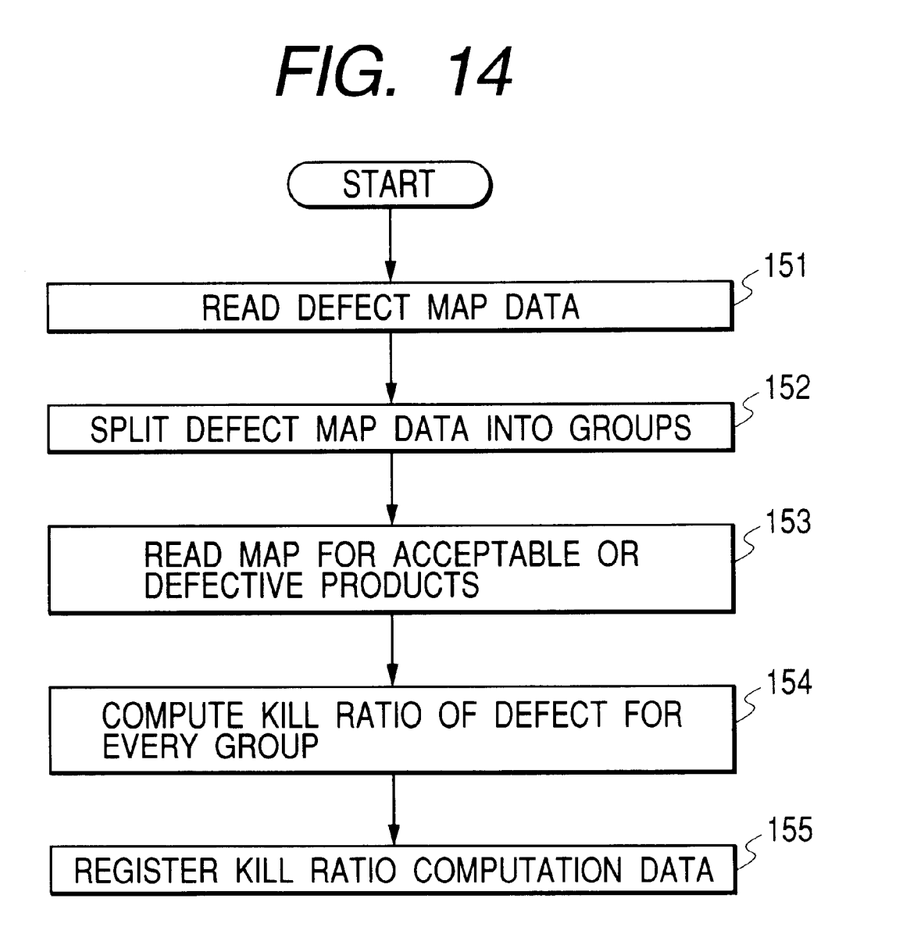
FIG. 14 shows an example of the creation procedure of kill ratio computation data.

FIG. 14 is an embodiment showing the procedure in which kill ratio computation data is created and registered. In FIG. 14, processing 151 reads defect map data. The processing 151 is the same processing as the processing 11 shown in FIG. 1.

Figure 15:
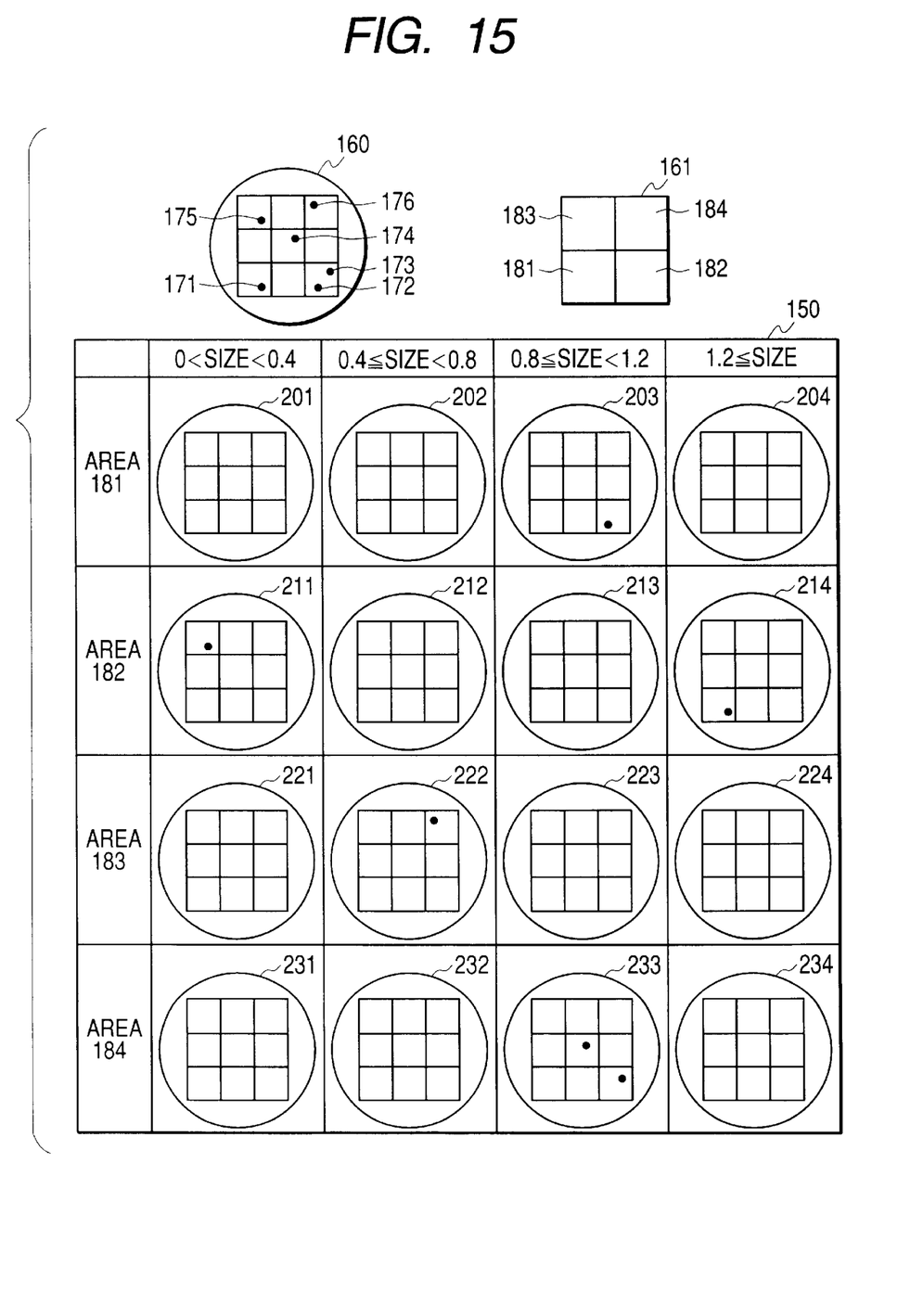
FIG. 15 shows an example of classifying the defect map data into groups.

Subsequently, in FIG. 14, processing 152 performs group splitting of defect map data. FIG. 15 is an example of a group splitting method. FIG. 15 is an example in which the defect map data is split into a total of 16 by splitting the area of an LSI chip into four and splitting the size of a defect into four in the same method as the kill ratio computation data shown in FIG. 6. A chip 161 is split into areas 181 to 184. The lower left, the lower right, the upper left, and the upper right are defined as the area 181, the area 182, the area 183, and the area 184 respectively. The example in which a defect map 160 is split into groups is a table 150. 201 to 234 are individual defect maps after they are split into groups. A defect 171 of the defect map 160 belongs to the defect map 214 because the size is 1.2 or more in the area 182. A defect 172 belongs to the defect map 203 because the size is 0.8 or more in the area 181. Similarly, a defect 173 belongs to the defect map 233, a defect 174 belongs to the defect map 233, a defect 175 belongs to the defect map 211, and a defect 176 belongs to the defect map 222.

Subsequently, in FIG. 14, processing 153 reads a bin map. The bin map is the result of a probing test that is the final test of the wafer production process and decides a good product or a bad product every LSI chip, as in a map 240 of FIG. 16. Here, "G" indicates a good chip and "B" indicates a bad chip.

Subsequently, in FIG. 14, processing 154 computes a kill ratio of a defect every group.

Figure 16:
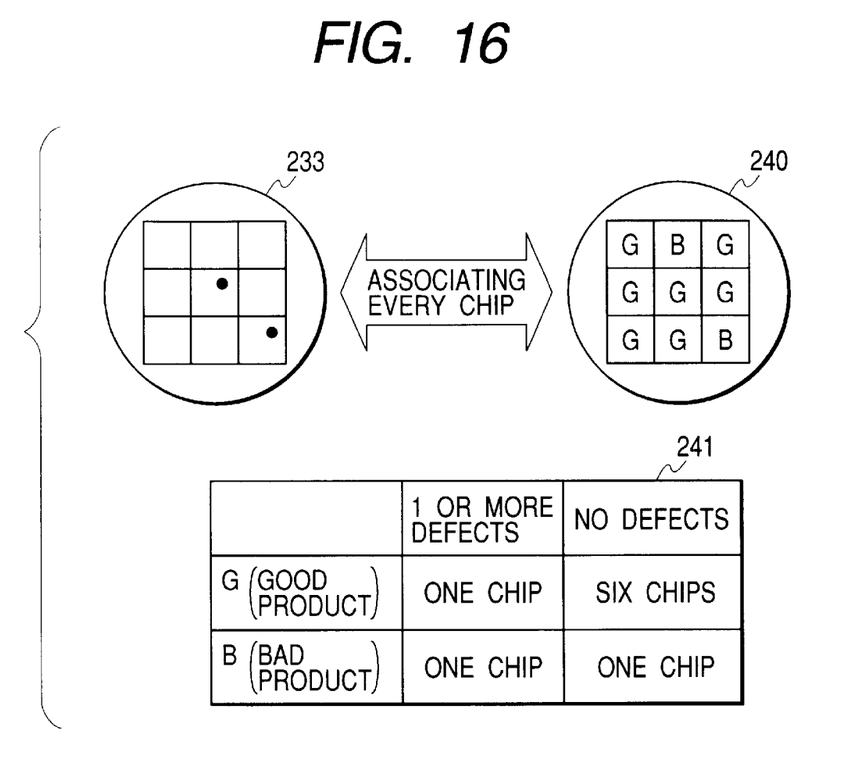
FIG. 16 shows an example of a kill ratio computation method.

FIG. 16 shows an example of a method by which the kill ratio of the defect is computed. FIG. 16 shows the kill ratio computation method of the defect that belongs to the defect map 233 in the group splitting of FIG. 15. The respective same chip of the defect map 233 and the bin map 240 is associated and a correlation table shown in 241 is created. The correlation table shows that there are one chip that contains a defect in the defect map 233 and is "G" in the bin map 240, one chip that contains a defect in the defect map 233 and is "B" in the bin map 240, six chips that do not contain any defects in the defect map 233 and is "G" in the bin map 240, one chip that does not contain any defects in the defect map 233 and is "B" in the bin map 240. The kill ratio of the defect map 233 is set to $1-\{1/(1+1)\}/\{6/(6+1)\}=0.417$ using the number of chips of the correlation table 241. This computation is performed for all groups. In the example, a computation example in the defect map data of a single wafer is shown, but desirably, the average should be used by performing computation from the defect map data of multiple wafers.

Figure 2:
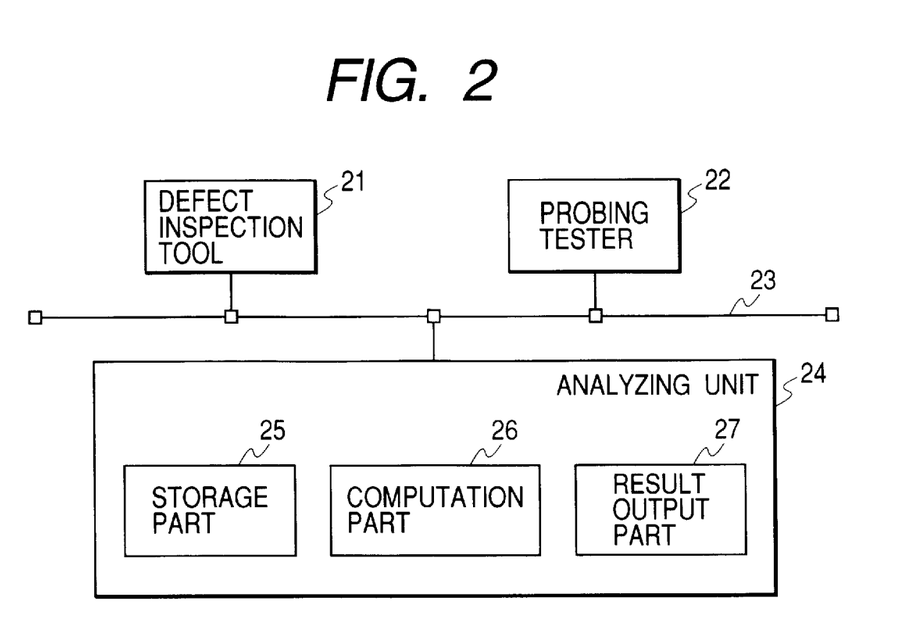
FIG. 2 is a block diagram showing an embodiment of an inspection system according to the present invention.

Subsequently, FIG. 2 is an example of the block diagram showing a system according to the present invention. 21 is a defect inspection tool, 22 is a probing tester, 23 is a local area network, and 24 is an analyzing unit. The analyzing unit 24 has a storage part 25, a computation part 26, and a result output part 27. The defect inspection tool 21, the probing tester 22, and the analyzing unit 24 are connected via the local area network 23. Such defect map data as 41 of FIG. 4 is obtained from the defect inspection tool 21 via the local area network 21 and stored in the storage part 25. The bin map of FIG. 16 is acquired from the probing tester 22 via the local area network 23 and stored in the storage part 25. Because the bin map is required only when the kill ratio computation data is created, it can also be stored in the storage part 25 by manual input or via a magnetic disc without passing through the local area network 23. The kill ratio computation data of FIG. 6 is stored in the storage part 25. The computation processing of the yield loss of FIG. 1 computes a yield loss in the computation part 26 and outputs it to the result output part 27 using the defect map data and kill ratio computation data read from the storage part 25. Further, the kill ratio computation data creation processing shown in FIG. 14 uses the defect map data and the bin map read from the storage part 25 to anew create and update the data in the computation part 26, and store the data in the storage part 25.

Figure 17:
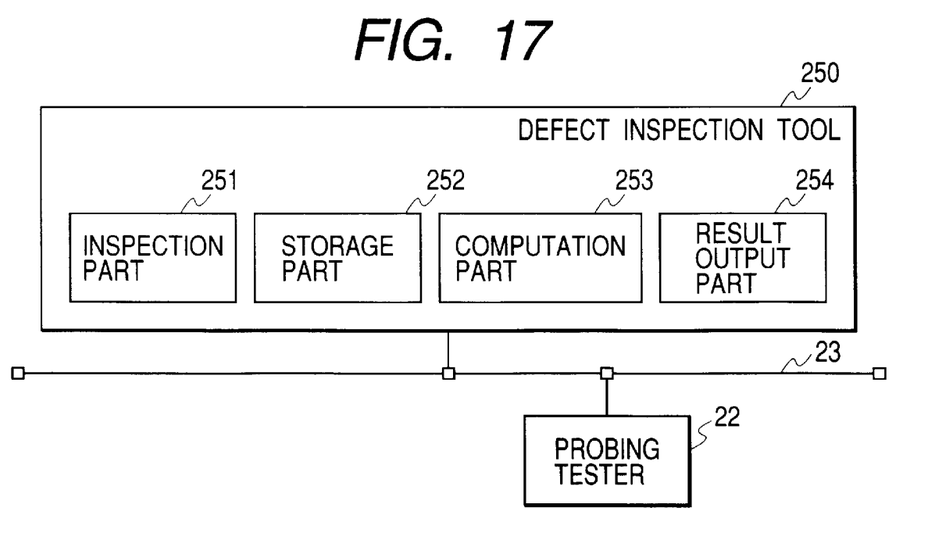
FIG. 17 is a block diagram showing an embodiment of an inspection apparatus according to the present invention.

Further, FIG. 17 is an example of the block diagram showing a defect inspection tool according to the present invention. A defect inspection tool 250 is provided with an inspection part 251, a storage part 252, a computation part 253, and a result output part 254. The inspection part 251 detects a defect on a wafer and creates such defect map data as 41 of FIG. 4, then stores them in the storage part 252. A bin map is acquired from the probing test result 22 via the local area network 23 and is stored in the storage part 252. The bin map can also be stored in the storage part 252 by manual input or via a magnetic disc without passing through the local area network 23. The storage part 252 stores the kill ratio computation data shown in FIG. 6 in addition to the defect map data and the bin map. The defect map data and the kill ratio computation data stored in the storage part 252 are read and a yield loss is computed, then the computed result is output to the result output part 254. Further, the kill ratio computation data creation processing uses the defect map data and the bin map read from the storage part 252 to anew create and update the data in the computation part 253, and store them in the storage part 252.

As described above, according to the present invention, a system, an apparatus, that can convert and output a yield loss from the result of a defect inspection, such as a dark-field inspection and a bright-field inspection of a semiconductor integrated circuit and a manufacturing method of a semiconductor device are provided. As a result, the management of a defect that cope with yield can immediately be performed after the dark-field inspection and bright-field inspection.

What is claimed is:

1. An inspection system, comprising:
    an inspection means that detects the positions and size of particles or pattern defects with which an inspected object is provided;
    a storage means that is connected to the inspection means via a network and stores inspection data that the inspection means detected and obtained and kill ratio computation data for the position and size of the particles or pattern defects in a device that is formed in the inspected object, wherein the storage means further stores a decision result of good products and bad products in a probing test of an inspected object and the inspection data detected by the inspection means and the kill ratio computation data are created from the decision result of the good and bad products in the probing test; and
    a computation means that computes kill ratios of individual particles or pattern defects based on the inspection data and the kill ratio computation data and kill ratios for every device that comprises the inspected object from the kill ratio of every individual particle or pattern defect.

2. An inspection system, comprising:
    an inspection means that detects the positions and size of particles or pattern defects with which an inspected object is provided;
    a storage means that is connected to the inspection means via a network and stores inspection data that the inspection means detected and obtained and kill ratio computation data for the position and size of the particles or pattern defects in a device that is formed in the inspected object;
    a computation means that computes kill ratios of individual particles or pattern defects based on the inspection data and the kill ratio computation data and kill ratios for every device that comprises the inspected object from the kill ratio of every individual particle or pattern defect; and
    an output means that outputs kill ratios for every individual device that comprises an inspected object as in wafer-shaped two-dimensional map information.

3. An inspection apparatus, comprising:
    an inspection means that detects the positions and size of particles or pattern defects with which an inspected object is provided:
    a storage means that is connected to the inspection means via a network and stores inspection data that the inspection means detected and obtained and kill ratio computation data for the positions and size of the particles or pattern defects in a device that is formed in the inspected object, wherein the storage means further stores the decision result of a good product and a bad product in a probing test of an inspected object and the inspection data detected by the inspection means and the kill ratio computation data are created from the decision result of the good and bad products in the probing test; and
    a computation means that computes kill ratios of individual particles or pattern defects based on the inspection data and the kill ratio computation data and kill ratios for every device that comprises the inspected object from the kill ratio of every individual particle or pattern defect.

4. An inspection apparatus, comprising:
    an inspection means that detects the positions and size of particles or pattern defects with which an inspected object is provided;
    a storage means that is connected to the inspection means via a network and stores inspection data that the inspection means detected and obtained and kill ratio computation data for the positions and size of the particles or pattern defects in a device that is formed in the inspected object;
    a computation means that computes kill ratios of individual particles or pattern defects based on the inspection data and the kill ratio computation data and kill ratios for every device that comprises the inspected object from the kill ratio of every individual particle or pattern defect; and
    an output means that outputs kill ratios for every individual device that comprises an inspected object as in wafer-shaped two-dimensional map information.

5. An inspection system, comprising:

a defect inspection tool for detecting positions and sizes of particles or pattern defects in an inspected object;

a probe tester for testing devices in the inspected object;

data storage for storing inspection data from the defect inspection tool and kill ratio computation data for the position and size of the particles or pattern defects in each device in the inspected object, wherein the data storage is further for storing a decision result of good products and bad products in a device test by the probe tester of an inspected object, and the inspection data from the defect inspection tool and the kill ratio computation data are created from the decision result of the good and bad products in the device test by the probe tester; and a processing unit for computing kill ratios of individual particles or pattern defects based on the inspection data and the kill ratio computation data, of every device that comprises the inspected object.

6. The inspection system according to claim 2, wherein:

the data storage and the processing unit are elements of a computer; and the inspection system further comprises a local area network for communicating data between the computer and the defect inspection tool and the probe tester.

7. The inspection system according to claim 6, wherein:

the data storage, the processing unit and the output screen are elements of a computer system; and the inspection system further comprises a local area network for communicating data between the computer and the defect inspection tool and the probe tester.

8. An inspection system, comprising:

a defect inspection tool for detecting positions and sizes of particles or pattern defects in an inspected object;

a probe tester for testing devices in the inspected object;

data storage for storing inspection data from the defect inspection tool and kill ratio computation data for the position and size of the particles or pattern defects in each device in the inspected object;

a processing unit for computing kill ratios of individual particles or pattern defects, based on the inspection data and the kill ratio computation data, of every device that comprises the inspected object from the kill ratio; and an output screen for outputting kill ratios for every individual device that comprises an inspected object, as wafer-shaped two-dimensional map information.

\* \* \* \* \*